US010204663B2

(12) United States Patent
Park

(10) Patent No.: US 10,204,663 B2
(45) Date of Patent: *Feb. 12, 2019

(54) METHODS AND APPARATUSES FOR COMPENSATING FOR SOURCE VOLTAGE

(71) Applicant: Micron Technology, Inc., Boise, ID (US)

(72) Inventor: Jaekwan Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/454,975

(22) Filed: Mar. 9, 2017

(65) Prior Publication Data
US 2017/0178696 A1 Jun. 22, 2017

Related U.S. Application Data

(63) Continuation of application No. 15/019,687, filed on Feb. 9, 2016, now Pat. No. 9,595,303, which is a continuation of application No. 13/689,386, filed on Nov. 29, 2012, now Pat. No. 9,257,154.

(51) Int. Cl.
G11C 5/14 (2006.01)
G11C 7/06 (2006.01)
G11C 7/08 (2006.01)
G11C 7/12 (2006.01)
G11C 16/24 (2006.01)
G11C 16/26 (2006.01)
G11C 7/14 (2006.01)
G11C 7/22 (2006.01)

(52) U.S. Cl.
CPC ............... *G11C 5/147* (2013.01); *G11C 7/06* (2013.01); *G11C 7/062* (2013.01); *G11C 7/08* (2013.01); *G11C 7/12* (2013.01); *G11C 7/14* (2013.01); *G11C 7/22* (2013.01); *G11C 16/24* (2013.01); *G11C 16/26* (2013.01); *G11C 2207/063* (2013.01)

(58) Field of Classification Search
CPC .. G11C 5/14; G11C 5/147; G11C 7/00; G11C 7/06; G11C 7/08; G11C 7/12; G11C 7/14; G11C 7/22; G11C 16/24; G11C 16/26; G11C 7/062; G11C 2207/063
USPC .... 365/189.09, 189.07, 189.15, 185.21, 205, 365/207, 185.23
See application file for complete search history.

(56) References Cited

U.S. PATENT DOCUMENTS

| 6,337,823 | B1 | 1/2002 | Seo et al. |
| 7,643,347 | B2 | 1/2010 | Abiko et al. |
| 7,701,761 | B2 | 4/2010 | Pan et al. |
| 7,751,249 | B2 | 7/2010 | Lee et al. |
| 7,957,197 | B2 | 6/2011 | Nguyen et al. |
| 9,257,154 | B2* | 2/2016 | Park .................. G11C 7/08 |

(Continued)

Primary Examiner — Tan T. Nguyen
(74) Attorney, Agent, or Firm — Dorsey & Whitney LLP

(57) ABSTRACT

Apparatuses and methods for compensating for source voltage are described. An example apparatus includes a source cooled to a memory cell and a read-write circuit coupled to the memory cell. The apparatus further includes a sense current generator coupled to a node or the source and to the read-write circuit, the sense current generator configured to control provision of a sense current by the read-write circuit responsive to a voltage of the node of the source.

12 Claims, 6 Drawing Sheets

(56) References Cited

U.S. PATENT DOCUMENTS 9,595,303 B2* 3/2017 Park .................. G11C 7/08
2010/0128551 A1* 5/2010 Tanzawa .............. G05F 1/575
　　　　　　　　　　　　　　　　　　　365/226

* cited by examiner

METHODS AND APPARATUSES FOR COMPENSATING FOR SOURCE VOLTAGE

CROSS REFERENCE TO RELATED APPLICATIONS

This application is a continuation of U.S. patent application Ser. No. 15/019,687, filed Feb. 9, 2016, issued as U.S. Pat. No. 9,595,303 on Mar. 14, 2017, which is a continuation of U.S. application Ser. No. 13/689,386 filed Nov. 29, 2012, and issued as U.S. Pat. No. 9,257,154 on Feb. 9, 2016. The aforementioned applications and patents are incorporated herein by reference in entirety and for any/all purpose.

TECHNICAL FIELD

Embodiments of the invention relate generally to electronic memories, and more particularly, in one or more of the illustrated embodiments, to reading of electronic memories.

DESCRIPTION OF RELATED ART

Advances in technology have resulted in high density memory architecture. Increased density of memory may lead to signal lines having smaller feature sizes, for example, thinner signal lines, which results in increased inherent parasitic resistance along the signal lines. Further, high density architecture fabrication can lead to fluctuation in memory device components. For example, similar components can exhibit slightly different electrical response characteristics under similar conditions. The increased resistance of signal lines and the fluctuation in memory device components can lead to decreased reliability during memory access operations. In some memories, a source line is coupled to memory cells of a memory array, and may be used for accessing the memory cells, for example, reading data from the memory cells. For memories having high capacity and a large page size, the source line may be physically long and have inherent parasitic resistance along its length. As dimensions of the source line are reduced, for example, the source line is thinner as a result of increased density of memory, the inherent parasitic resistance of the source line may increase. Increased resistance along the source line and variation in electrical response characteristics can lead to variances in sense current and voltage levels used to detect data along a sense line during a memory read operation. Variances in the sense current and voltage levels along a sense line can cause a detection circuit to detect an incorrect value stored in a memory cell.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments.

Figure 1:
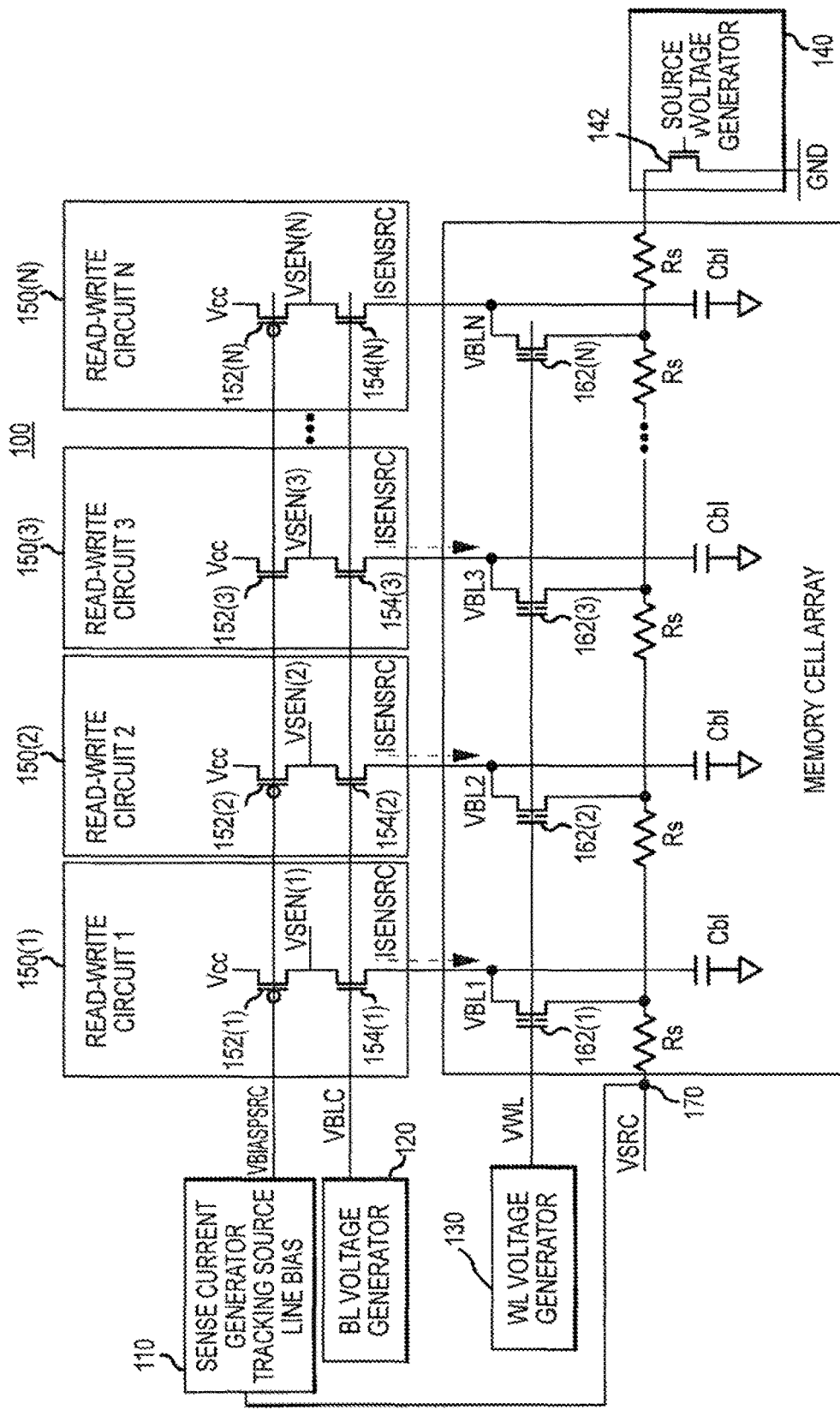
FIG. 1 is a diagram of a particular illustrative embodiment of an apparatus including a memory access circuit.

Referring to FIG. 1, a particular illustrative embodiment of an apparatus (e.g., an integrated circuit, a memory device, a memory system, an electronic device or system, a smart phone, a tablet, a computer, a server, etc.) including a memory access circuit is disclosed and generally designated 100. The apparatus 100 may include read-write circuits 150(1-N) each coupled to a memory cell array 160 having a plurality of memory cells 162(1-N). A sense current generator 110 and a bitline voltage generator 120 may be coupled to each of the read-write circuits 150(1-N) to provide a bias voltage signal VBIASPSRC and a bitline voltage signal VBLC, respectively, to each of the read-write circuits 150(1-N). The VBIASPSRC signal has a voltage that is based on the source voltage. A word line voltage generator 130 may be coupled to the memory cell array 160 to provide a word line voltage signal VWL to each of the memory cells 162(1-N) of the memory cell array 160. A source voltage generator 140 may be coupled to the source and configured to couple the source to a reference node. The reference node may be coupled to a voltage reference, for example, ground.

Each of the read-write circuits 150(1-N) may include a sense current transistor 152(1-N) coupled to a respective bitline voltage transistor 154(1-N) along a sense line. Each of the sense current transistors 152(1-N) may be coupled to a voltage supply note, such as a node supplying VCC. A gate of each, of the sense current transistors 152(1-N) may be coupled to the sense current generator 110. Each of the bitline voltage transistor 154(1-N) may be coupled to a respective bitline of the memory cell array 160. A gate of each of the bitline voltage transistors 154(1-N) may be coupled to the bitline voltage generator 120 to receive the VBLC signal. Each of the read-write circuits 150(1-N) may provide a sense signal VSEN1-N to a respective detection circuit (not shown). The detection circuits may determine a data state of the memory cells based on the respective VSEN1-N signals.

Each bitline of the memory cell array 160 may be coupled to a respective string of memory cells, each of which being represented in FIG. 1 as a respective memory cell 162(1-N). In an embodiment, each of the memory cells 162(1-N) may be a non-volatile memory cell. Each of the memory cells 162(1-N) may be coupled (e.g. either directly, as in the case of a NOR architecture, or indirectly, as in the case of a NAND architecture) to a source. The source may have an inherent parasitic resistance Rs and each, bitline may have an inherent capacitance Cbl. In an embodiment, the source may include a source line, a source slot, and/or a source region.

During a read operation, the sense current generator 110 provides the VBIASPSRC signal to a gate of each of the sense current transistors 152(1-N) to control the provision of a sense current during a memory cell bitline development delay time. The bit line development delay time is a period of time to allow a voltage to develop on the bit line in preparation to read a respective memory cell 162(1-N). Further, the bitline voltage generator 120 provides the VBLC signal to a gate of each of the bitline voltage transistors 154(1-N) to clamp each cell bitline at a baseline voltage for the read operation. The source voltage generator 140 couples the source to the reference node to provide a conduction path via the source voltage transistor 142. The wordline voltage generator 130 provides the VWL signal to a gate of each of the memory cells 162(1-N) of a plurality of the memory cell array 160. In some embodiments, the plurality of memory cells represent a page of memory cells coupled to a word line on which the VWL signal is provided. As explained above, each of the memory cells 162(1-N) stores data, and a data of a corresponding memory cell 162(1-N) is based on whether (and/or to what extent) the corresponding memory cell 162(1-N) is programmed or erased. For example, in the case of charge storage memory cells, such as those conveniently used in NAND flash memory devices, when the VWL signal provided to the gate of each of the memory cells 162(1-N) exceeds a corresponding threshold voltage VTH, the respective memory cell 162(1-N) conducts, coupling the bitline through the source to the reference node. As a result, the corresponding VSEN (1-N) is low. Alternatively, when the VWL signal does not exceed a corresponding threshold voltage VTH, the respective memory cell 162(1-N) does not conduct and the corresponding VSEN(1-N) is high.

As explained above, the source has an inherent parasitic resistance RS. Further, some of the memory cells 162(1-N) may have electrical characteristics that facilitate higher conductivity, thereby providing an increased current through the corresponding bitline, and, accordingly, increased current through the source. The increased current, coupled with the inherent parasitic resistance RS of the source may cause a source voltage signal VSRC to be greater than a voltage of the reference node. To compensate for the increased voltage, the sense current generator 110 may be coupled to the source, and may provide (e.g., generate) the VBIASPSRC signal with a voltage level that provides the sense current responsive to the voltage level of the VSRC signal rather than a voltage of the reference node (e.g., ground).

Although FIG. 1 illustrates a string of memory cells as a single memory cell, between the bitline and the source (as may be the case in NOR architecture) in order to help simplify the discussion of the disclosure, embodiments of the disclosure also encompass those where the string of memory cells includes a plurality of memory cells coupled in series between the bitline and the source, where the single memory cell 162 in each string should be viewed as representative of one of a plurality of memory cells in the string. Further, one of ordinary skill in the art would appreciate that the sense current generator 110 may be coupled to the source at any node along the source. In an embodiment, the sense current generator 110 is coupled to the source outside the memory cell array 160 at a node adjacent to the memory cell 162(1). In another embodiment, the sense current generator 110 is coupled to the source outside the memory cell array 160 at a node adjacent to the memory cell 162(N). In yet another embodiment, the sense current generator 110 is coupled to the source inside the memory cell array 160. One of ordinary skill in the art would also appreciate that the VSRC may vary based on where a node is along the source where the sense current generator 110 is coupled. For example, coupling the sense current generator 110 to the source at a node adjacent to the memory cell 162(1) may result, in a lower VSRC voltage than coupling at a node adjacent to the memory cell 162(N).

Figure 2:
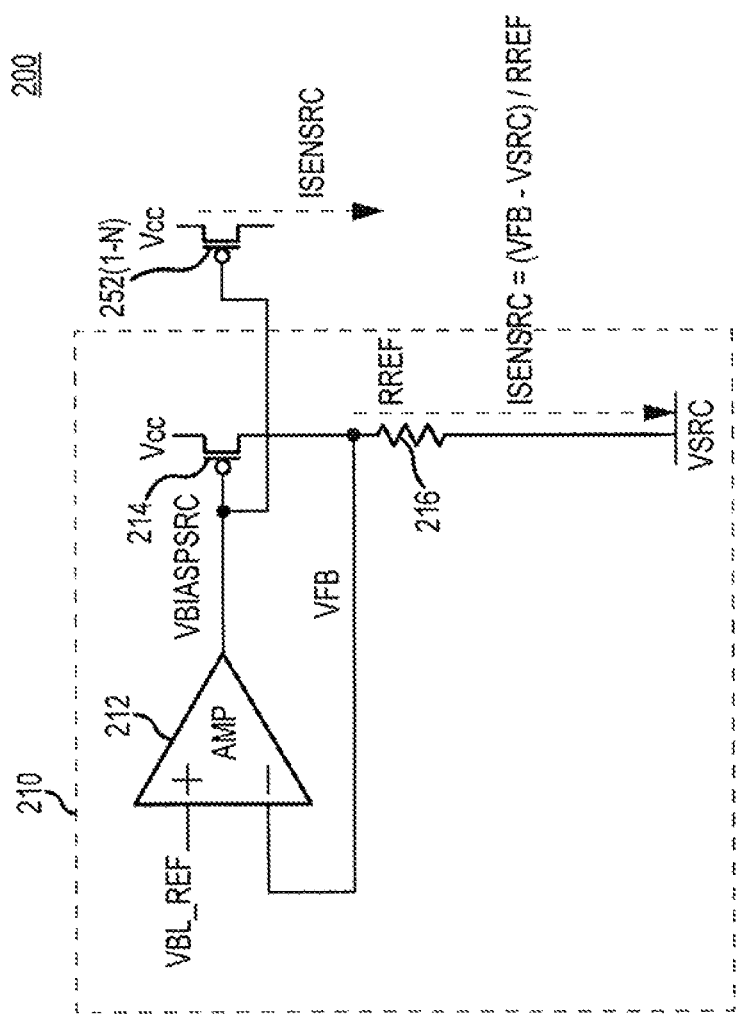
FIG. 2 is a diagram of a particular illustrative embodiment of an apparatus including a sense current generator.

Referring to FIG. 2, an apparatus 200 including a sense current generator according to an embodiment of the invention is disclosed. The apparatus 200 may include a sense current generator 210 that includes an amplifier 212 coupled to a gate of a feedback transistor 214 and a gate of each of sense current transistors 252(1-N). One sense current transistor is shown in FIG. 2, but represents a plurality of sense current transistors 252(1-N). The sense current generator 210 may include the sense current generator 110 of FIG. 1. Each of the sense current transistors 252(1-N) may include one of the sense current transistor 152(1-N) of FIG. 1.

The sense current generator 210 receives a bitline reference voltage signal VBL_REF at a first input and a feedback voltage signal VFB at a second input. The sense current generator 210 provides a bias voltage VBIASPSRC at an output to a gate of the feedback transistor 214 and a gate of each of the sense current transistors 252(1-N). The VBIASPSRC signal has a voltage that is based on the source voltage.

The feedback transistor 214 may have a source coupled to a voltage supply node, such as a node coupled to VCC and a drain coupled to a source voltage signal VSRC via a reference resistance RREF 216. The drain of the feedback transistor 214 may be coupled to the second input of the amplifier 212 to provide the VFB signal.

During operation, the amplifier 212 provides the VBIASPSRC signal to provide a sense current ISENSRC through a sense line of each read-write circuit such as the read-write circuit 150(1-N) of FIG. 1. The amplifier 212 may control a voltage level of the VBIASPSRC signal based on the voltage of the VFB signal relative to the voltage of the VBL_REF signal. For example, assuming a constant voltage VBL_REF signal, the voltage of the VBIASPSRC signal increases as the voltage of the VFB signal increases and the voltage of the VBIASPRC signal decreases as the voltage of the VFB signal decreases. A voltage level of the VFB signal is based on current through the feedback transistor 214 as controlled by the VBIASNSRC and relative to the VSRC signal. As a result, the ISENSRC current is adjusted based on the voltage of the VSRC signal. As explained above, the VBIASPSRC signal may be provided to each of the sense current transistors 252(1-N) to provide the sense current ISENSRC through each of the sense lines.

Providing the VFB signal having a value that is basal on a voltage differential between the VCC and the VSRC signal compensates for inherent parasitic resistance in the source. In contrast to the apparatus 200, a VFB signal based on a voltage differential between the VCC signal and a reference voltage provides the same sense current through the sense lines regardless of a voltage level of the VSRC signal, for example, when the voltage of the VSRC signal increases to be greater than a voltage level of the reference voltage. An increased voltage of the VSRC signal may adjust (e.g., alter) the relative voltage of the VSEN(1-N) voltages, and may lead to erroneous reading of data stored in the corresponding memory cell. Adjusting the ISENSRC current responsive to the voltage of the VSRC signal (e.g., reducing ISENSRC for increasing voltage of the VSRC signal and increasing ISENSRC current for decreasing voltage of the VSRC signal) may compensate for changes to the VSEN(1-N) voltages caused by the changing voltage of the VSRC signal.

Figure 3:
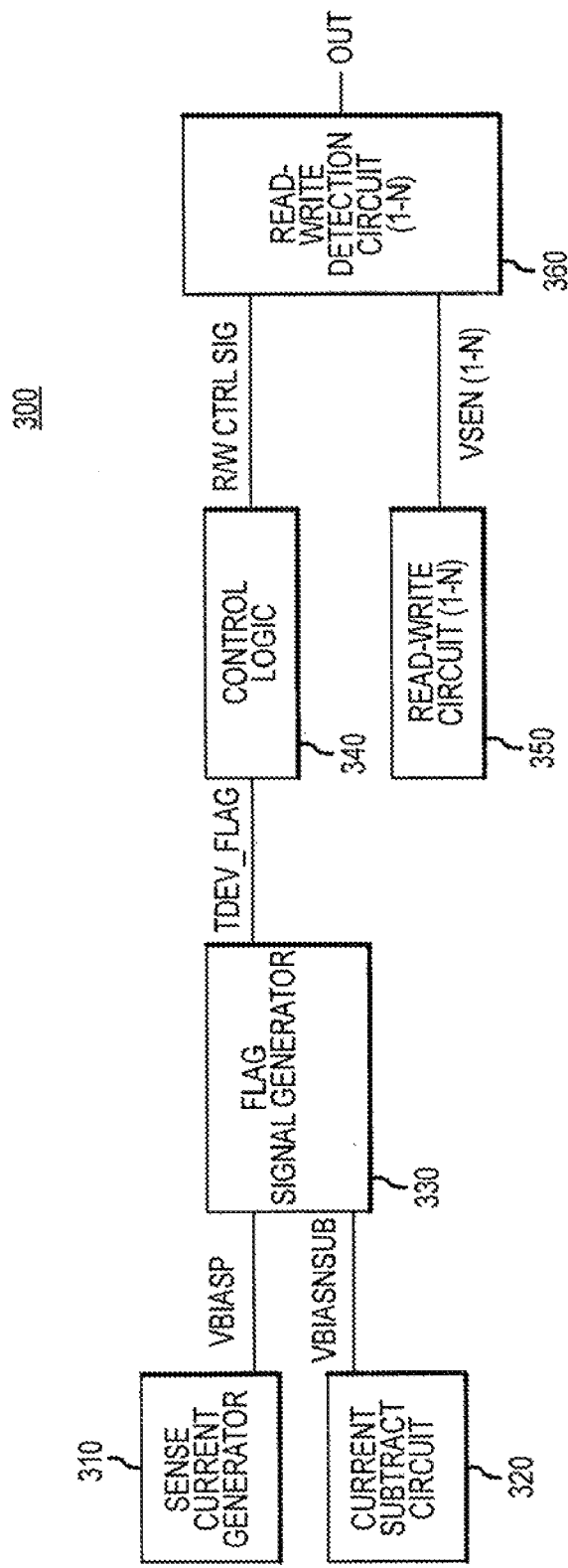
FIG. 3 is a diagram of a particular illustrative embodiment of an apparatus including a flag signal generator.

In other embodiments, a development time before read-write detection circuits detect stored data, is adjusted to compensate for changing voltage of the VSRC signal. Referring to FIG. 3, a particular block diagram of an apparatus 300 including a sense current generator 310 and a current subtract circuit 320 coupled to a flag signal generator 330. The flag signal generator 330 provides the TDEV_FLAG signal to control logic 340. The control logic 340, along with a plurality of read-write circuits (1-N) 350, provide signals to a read-write detection circuit (1-N) 360 to facilitate reading data from a memory array.

The sense current generator 310 may be configured to provide a bias voltage VBIASP to the plurality of read-write circuits (1-N) 350 based on a voltage differential between the voltage supply signal VCC and a reference voltage signal VREF, rather than a voltage difference between the voltage supply signal VCC and the source voltage signal VSRC. Based on the VBIASP voltage the plurality of read-write circuits (1-N) 350 provide a sense current through a corresponding bitline coupled to the plurality of read-write circuits (1-N) 350.

The current subtract circuit 320 may provide the subtracted bias voltage signal VBIASNSUB to the flag signal generator 330. The VBIASNSUB signal may be provided (e.g. generated) by comparing a sense current provided responsive to the VBIASP signal with a sense current provided responsive to the VBIASPSRC signal, such as the VBIASPSRC signal provided as described with reference to FIGS. 1 and 2.

During operation, the flag signal generator 330 may receive the VBIASP signal and the VBIASNSUB signal. The flag signal generator 330 may set the TDEV_FLAG signal from a logical low value to a logical high value after a delay, where a length of the delay is based on the received VBIASP and VBIASNSUB signals. The TDEV_FLAG signal may be used b the control logic 340 to provide a read-write control signal R/W CTRL SIG to read-write detection circuits (1-N) 360. For example, the control logic 340 may set the R/W CTRL SIG signal to a logical high value upon receiving the TDEV_FLAG signal having a logical high value. The control logic 340 may set the R/W CTRL SIG signal to the logical high value for a particular length of time, and may set the R/W CTRL SIG signal to a logical low value once the particular length of time has elapsed. The flag signal generator 330 may also set the TDEV_FLAG signal to a logical low value once the particular length of time has elapsed. Responsive to the R/W CTRL SIG having the logical high value, the read-write detection circuits (1-N) 360 may initiate detection of sense voltage signals VSEN(1-N) received from each one of the respective read-write circuits (1-N) 350. A voltage level of each of the VSEN(1-N) signals may indicate a value of data stored in a corresponding memory cell of a memory array. The read-write circuits (1N) 350 may include the read-write circuits 150 of FIG. 1. Each of the read-write circuits (1-N) 350 may provide a sense current signal (not shown) to the read-write detection circuits (1-N) 360 rather than or in addition to the VSEN(1-N) signals, and the mad-write detection circuits (1-N) 360 may use the sense current signals to detect a value of data stored in a respective memory cell.

In an embodiment, the length of the delay prior to setting the TDEV_FLAG signal is set to the logical high value by the flag signal generator 330 is inversely related to a voltage level of the VBIASNSUB signal, e.g., as the voltage level of the VBIASNSUB signal increases, the length of the delay before the flag signal generator 330 sets the TDEV_FLAG signal to the logical high value decreases. When a voltage level of the VBIASNSUB signal is approximately equal to zero, the flag signal generator 330 sets the TDEV_FLAG signal to the logical high value at a first time. Further, when the voltage level of the VBIASNSUB is a second value that is greater than zero, the flag signal generator 330 sets the TDEV_FLAG signal to the logical high value at a second time. In an embodiment, the first time is later than the second time.

Configuring the time before initiating detection of data stored in a memory cell based on a voltage of a source compared to a reference voltage may prevent erroneous reading of data from the memory cell. If the voltage of the source is greater than the reference voltage and the sense current generator 310 provides a sense current based on the reference voltage, it will cause a corresponding sense voltage to develop more quickly. Having a development time that is too long may, lead to the corresponding sense voltage or current to become over-developed and exceed a data threshold voltage or current used for comparison with the corresponding sense voltage or current, respectively, which may result in erroneous data sensing. By controlling the read-write detection circuits (1-N) using the TDEV_FLAG signal, the read-write detection circuits (1-N) may detect stored data sooner responsive to an increasing voltage of the VSRC signal (e.g., as represented by the VBIASNSUB signal). As a result, the data detection may occur before the sense voltage or current becomes over-developed, which may compensate for increasing voltage of the VSRC signal.

Figure 4:
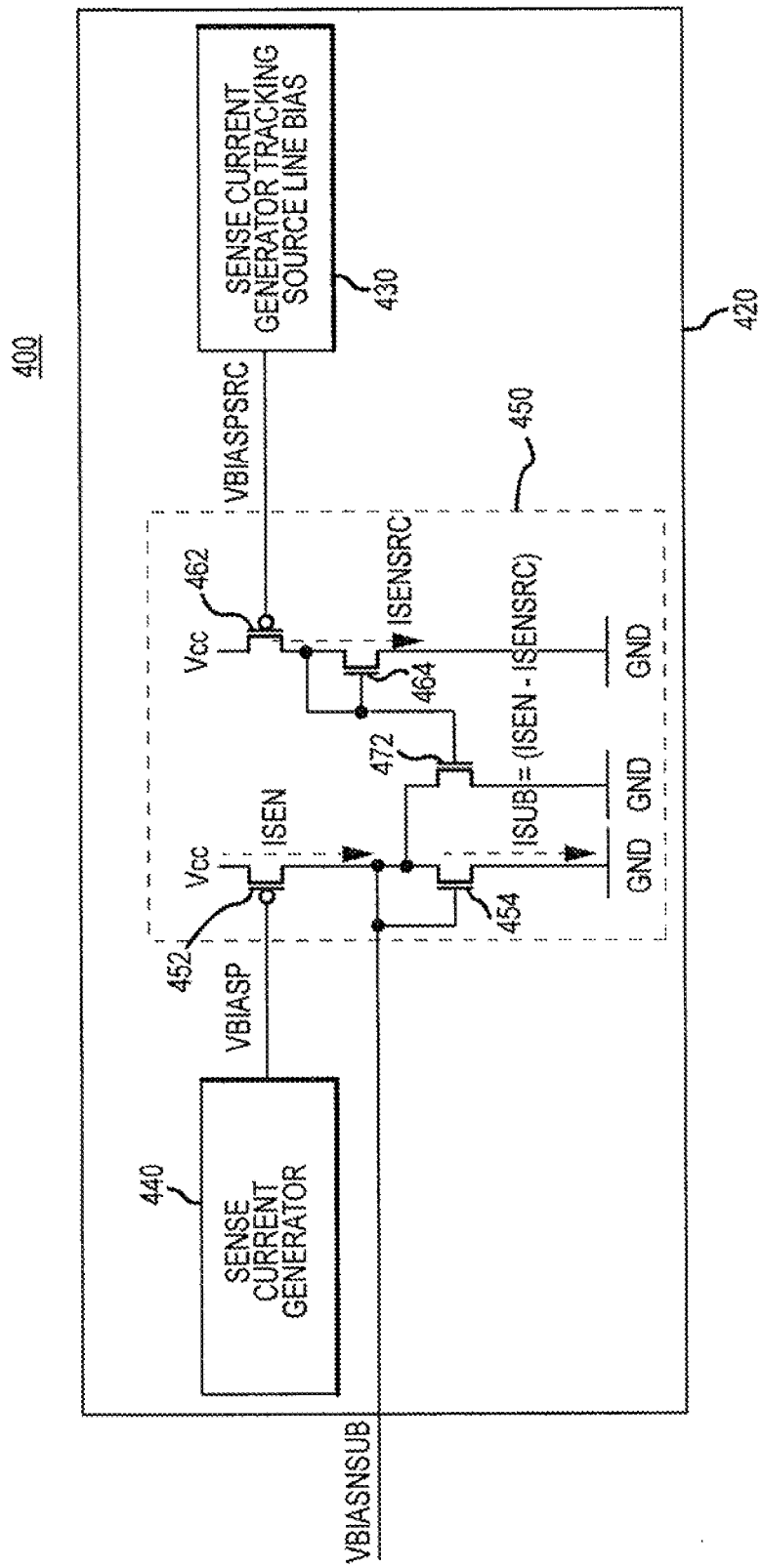
FIG. 4 is a diagram of a particular illustrative embodiment of an apparatus including a currently subtract circuit.

Referring to FIG. 4, an apparatus 400 including a first sense current generator 440 and a second sense current generator 430 that are each coupled to a current subtract circuit 450 to provide a subtracted bias voltage signal VBIASNSUB. The current subtract circuit 450 may include the current subtract circuit 320 of FIG. 3. The sense current generator 430 may include the sense current generator 110 of FIG. 1 and/or the sense current generator 1210 of FIG. 2. The sense current generator 440 may include the sense current generator 310 of FIG. 3.

In operation, similar to sense current generator 110 of FIG. 1 and/or the sense current generator 210 of FIG. 2, the sense current generator 430 may provide a bias voltage signal VBIASPSRC to a gate of a sense voltage bias transistor 462, which provides a sense current ISENSRC. Additionally, the sense current generator 440 may provide a bias voltage signal VBIASP to a gate of a sense voltage bias transistor 452, which provides a sense current based reference voltage ISEN. The VBIASPSRC signal may have a voltage that is based on a source voltage and the VBIASP signal may have a voltage that is based on a reference voltage. The current subtract circuit 450 subtracts the ISENSRC current from the ISEN current via a current mirror transistor 464, a voltage subtraction transistor 472, and a subtracted voltage bias transistor 454 to provide a subtraction current ISUB. The VBIASNSUB signal provided at a node between the sense voltage bias transistor 452 and the subtracted voltage bias transistor 154 is based on the ISUB current. In operation, when the ISEN current is approximately equal to the ISENSRC current, the ISUB current is approximately equal to zero, and, accordingly a voltage level of the VBIASNSUB signal is approximately equal to zero. As the ISENSRC current decreases in magnitude as compared with the ISEN current, the voltage level of the VBIASNSUB signal increases. As explained with reference to FIG. 3, as the voltage level of the VBIASNSUB signal increases, a length of time before the TDEV_FLAG is set to the logical high value becomes shorter.

Figure 5:
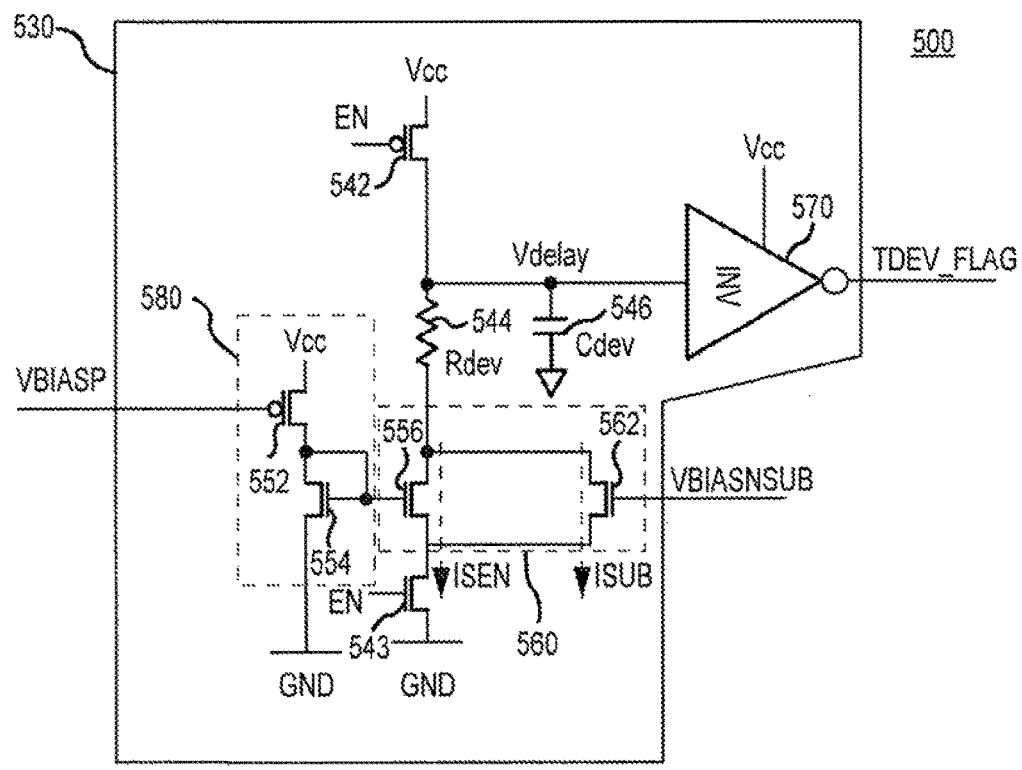
FIG. 5 is a diagram of a particular illustrative embodiment of a flag signal generator.

Referring to FIG. 5, an apparatus 500 including a flag signal generator 530 according to an embodiment of the invention is disclosed. The flag signal generator 530 that provides a development flag signal TDEV_FLAG based on a bias voltage signal VBIASP and a subtracted bias voltage signal VBIASNSUB. The flag signal generator 530 may be used as the flag signal generator 330 previously described with reference to FIG. 3.

The flag signal generator 530 may include a first enable transistor 542 and a second enable transistor 543, each coupled along a first path. The first enable transistor 542 may include opposite enable polarity as compared with the second enable transistor 543. For example, the first enable transistor 542 is enabled when an enable signal EN has a first logical value and disabled when the EN signal has a second logical value, and the second enable transistor 543 is disabled when the EN signal has the first logical value and enabled when the EN signal has the second logical value. The EN signal may be set to the second logical value upon commencement of a read operation, e.g. when a bias voltage is applied to a read-write circuit. The EN signal may be set to the first logical value upon completion of a read operation or after a particular (e.g., predetermined) period of time. The first enable transistor 542 may be coupled to a voltage supply node, such as VCC and the first enable transistor 542 may be coupled to a reference node, such as one coupled to GND.

A development resistance RDEV 544 and a discharge circuit 560 are coupled between the first enable transistor 542 and the second enable transistor 543 along the first path. The discharge circuit includes parallel discharge paths. A first discharge path includes a first discharge transistor 556 that is controlled by a bias voltage signal VBIASP via a mirror circuit 580. In an embodiment, the VBIASP signal is received at a gate of a bias voltage transistor 552, which controls a current through a current mirror transistor 554, and a voltage provided to a gate of the first discharge transistor 556. A second discharge path includes a second discharge transistor 562 that is controlled by a subtracted bias voltage signal VBIASNSUB.

The flag signal generator 530 also includes a second path coupled to the first enable transistor 542 in parallel with the first path. The second path includes a development capacitance CDEV 546 coupled to an inverter 570. The inverter 570 provides the TDEV_FLAG signal to control logic (not shown), such as the control logic 340 of FIG. 3.

In operation, while the EN signal has the first logical value (e.g., prior to initiating a read operation), the first enable transistor 542 is enabled, thus providing the VCC signal along the first path and along the second path. The second enable transistor 543 is disabled, which restricts current flow along the first path. Along the second path, the development capacitance CDEV 546 is charged via the VCC signal to provide a Vdelay voltage. Additionally, an input to the inverter 570 is a logical high value based on the VCC signal. Accordingly, prior to the read operation, the TDEV_FLAG signal having a logical low value is provided at an output of the inverter 570.

When the EN signal transitions from the first logical value to the second logical value (e.g., indicating a start of a read operation), the first enable transistor 542 is disabled, thus restricting the VCC signal from the first path and the second path. The development capacitance CDEV 546 remains charged immediately after the transition of the EN signal, which maintains the TDEV_FLAG signal at the logical low value. In addition, with the transition of the EN signal to the second logical value, the second enable transistor 543 becomes enabled, which facilitates current flow along the first path via the first discharge transistor 556 and the second discharge transistor 562. The current flow through the first discharge transistor 556 and the second discharge transistor 562 discharges the development capacitance CDEV 546. As the development capacitance CDEV 546 discharges, the input to the inverter 570 transitions from the logical high value to a logical low value, which causes the TDEV_FLAG signal to transition to the logical high value. In an embodiment, when a voltage level at the input of the inverter 570 becomes less than a voltage level of the VCC signal divided by two, the TDEV_FLAG signal transitions to the logical high value. Upon completion of the read operation, the EN signal may transition from the second logical value to the first logical value. The EN signal having the logical high value enables the first enable transistor 542, which provides the VCC signal to the input to the inverter 570, causing the input of the inverter 570 to transition from the logical low value to the logical high value. Accordingly, the TDEV_FLAG signal transitions from the logical high value to the logical low value at an output of the inverter 570.

As a rate of discharge of the development capacitance CDEV 546 increases, a development time period associated with the TDEV_FLAG signal transitioning to the second logical value decreases. The rate of discharge of the development capacitance CDEV 546 is controlled by a voltage level of the VBIASP signal and a voltage level of the VBIASNSUB signal. The VBIASP voltage may remain fixed based on a voltage differential between the VCC signal and the GND signal. The VBIASNSUB signal may supplement the VBIASP signal in discharging the development capacitance CDEV 546. As explained with reference to FIGS. 3 and 4, the VBIASNSUB signal is based on a voltage differential between a source voltage (e.g., the VSRC signal of FIGS. 1 and 2) and the GND signal. Decreasing the development time should reduce the likelihood of incorrectly reading data from memory cells of a memory array.

Figure 6:
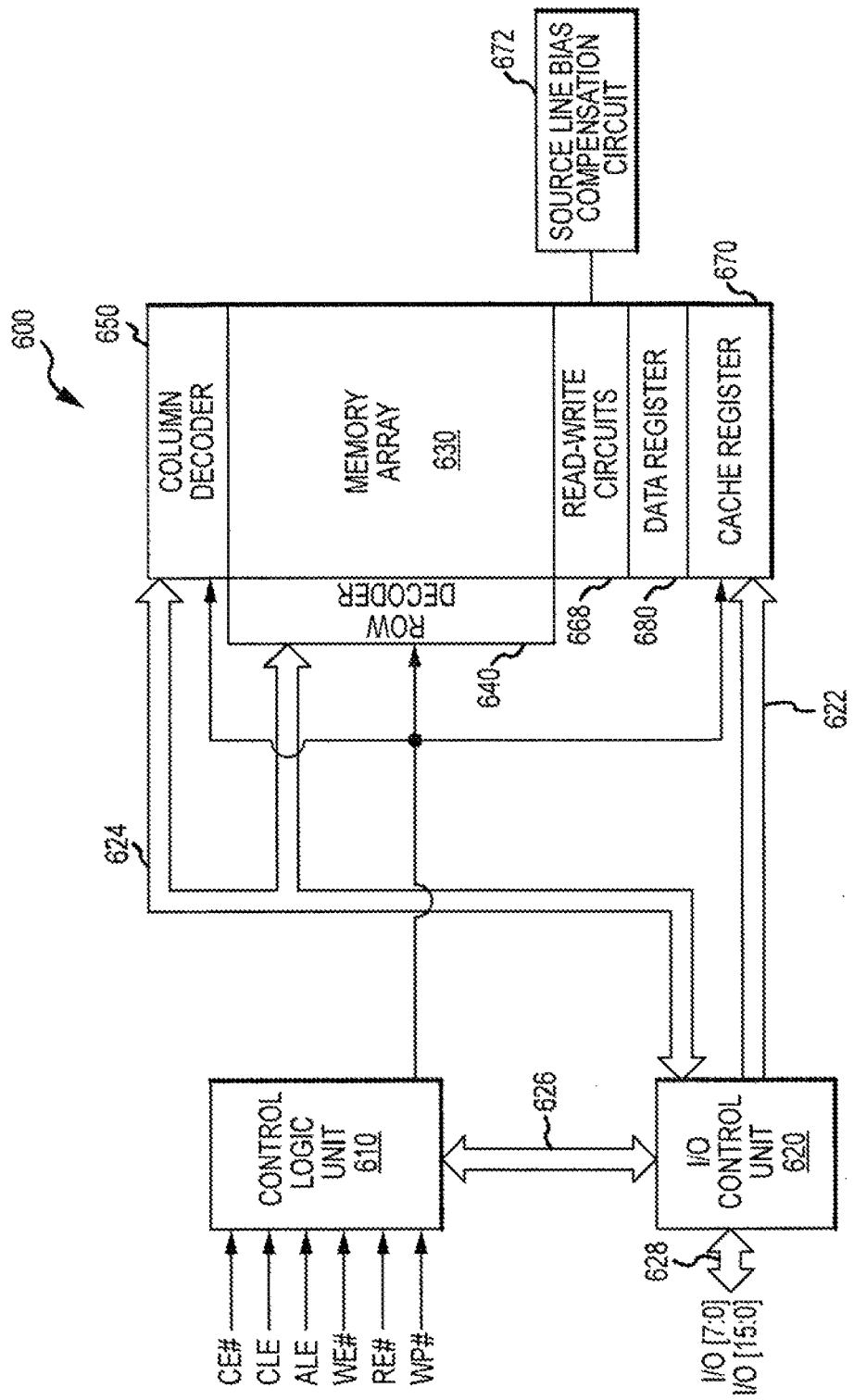
FIG. 6 is a diagram of a memory according to an embodiment of the invention.

FIG. 6 illustrates a memory 600 according to an embodiment of the present invention. The memory 600 includes a memory array 630 with a plurality of memory cells. The memory cells may be non-volatile memory cells, such as NAND flash cells, or may generally be any type of memory cells.

Command signals, address signals and write data signals may be provided to the memory 600 as sets of sequential input/output ("I/O") signals transmitted through an I/O bus 628. Similarly, read data signals may be provided from the memory 600 through the I/O bus 628. The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals either externally or through the command bus 626 to control the operation of the memory 600.

The address bus 624 applies block-row address signals to a row decoder 640 and column address signals to a column decoder 650. The row decoder 640 and column decoder 650 may be used to select blocks of memory or memory cells for memory operations, for example, read, program, and erase operations. The column decoder 650 may enable write data signals to be applied to columns of memory corresponding to the column address signals and allow read data signals to be coupled from columns corresponding to the column address signals.

In response to the memory commands decoded by the control logic unit 610, the memory cells in the array 630 are read, programmed, or erased. Read-write circuits 668 coupled to the memory array 630 receive control signals from the control logic unit 610 and include voltage generators for generating various pumped voltages for read, program and erase operations. The read-write circuits 668 may include the read-write circuits 150(1-N) of FIG. 1 and/or the read-write circuits 350 of FIG. 3. A source voltage compensation circuit 672 is coupled to the read, program, and erase circuits 668. The source voltage compensation circuit 672 may include embodiments of the present invention, including the sense current generator 110 of FIG. 1, the sense current generator 210 of FIG. 2, the sense current generator 310, the current subtract circuit 320, and/or the flag signal generator 330 of FIG. 3, the current subtract circuit 420 of FIG. 4, and/or the flag signal generator 530 of FIG. 5. The source voltage compensation circuit 672 in some embodiments adjusts a sense current used by the read, program, and erase circuits 668 based on a source voltage. In some embodiments, the source voltage compensation circuit 672 adjusts the detection time of the read, program, and erase circuits 668 based on the source voltage.

After the row address signals have been applied to the address bus 624, the I/O control unit 620 routes write data signals to a cache register 670. The write data signals are stored in the cache register 670 in successive sets each having a size corresponding to the width of the I/O bus 628. The cache register 670 sequentially stores the sets of write data signals for an entire row or page of memory cells in the array 630. All of the stored write data signals are then used to program a row or page of memory cells in the array 630 selected by the block-row address coupled through the address bus 624. In a similar manner, during a read operation, data signals from a row or block of memory cells selected by the block-row address coupled through the address bus 624 are stored in a data register 680. Sets of data signals corresponding in size to the width of the I/O bus 628 are then sequentially transferred through the I/O control unit 620 from the data register 680 to the I/O bus 628.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a sense current generator coupled to a node of a source line coupled to a memory cell, the sense current generator configured to control a sense current used to access the memory cell by sensing a current through a feedback transistor coupled to the source line via a reference resistance.

2. The apparatus of claim 1, wherein the sense current generator further comprises an amplifier coupled to the feedback transistor and the source line, the amplifier configured to provide a bias voltage to a read/write circuit based on a feedback voltage received at the input of the amplifier.

3. The apparatus of claim 1, further comprising a read/write circuit coupled to the memory cell.

4. The apparatus of claim 3, wherein the sense current generator configured to control the sense current used to access the memory cell comprises the sense current generator coupled to a sense current transistor of the read write circuit and the sense current generator configured to provide a bias voltage to a gate of the sense current transistor based on the voltage of the node of the source line.

5. The apparatus of claim 4, wherein the sense current generator is configured to provide the bias voltage to the read-write circuit responsive a memory access command.

6. The apparatus of claim 1, further comprising a string of memory cells that includes the memory cell.

7. A method, comprising:
providing a bias voltage to a read-write circuit and to a gate of a feedback transistor having a voltage based on a feedback voltage, wherein the feedback voltage is sensed from a node between the feedback transistor and a resistance coupled to a source line; and
providing a sense current at the read-write circuit having a value based on the voltage of the bias voltage.

8. The method of claim 7, further comprising detecting that the voltage of the source line is greater than a reference voltage.

9. The method of claim 7, wherein providing the bias voltage to the read-write circuit comprises providing the bias voltage to a gate of a sense current transistor.

10. The method of claim 7, further comprising activating a source line transistor to couple the source line to a reference node.

11. The method of claim 7, further comprising detecting a value stored in a memory cell based on the sense current.

12. The method of claim 7, further comprising receiving the feedback voltage from the feedback node.

* * * * *